US008352519B2

(12) United States Patent
Nath

(10) Patent No.: US 8,352,519 B2
(45) Date of Patent: Jan. 8, 2013

(54) MAINTAINING LARGE RANDOM SAMPLE WITH SEMI-RANDOM APPEND-ONLY OPERATIONS

(75) Inventor: Suman Kumar Nath, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 556 days.

(21) Appl. No.: 12/184,213

(22) Filed: Jul. 31, 2008

(65) Prior Publication Data

US 2010/0030809 A1    Feb. 4, 2010

(51) Int. Cl.
*G06F 17/30* (2006.01)

(52) U.S. Cl. ....................................................... 707/812
(58) Field of Classification Search .................. 707/600, 707/776, 738, 812
See application file for complete search history.

(56) References Cited

U.S. PATENT DOCUMENTS

| | | | |
|---|---|---|---|
| 5,392,415 A | 2/1995 | Badovinatz et al. | |
| 5,418,752 A | 5/1995 | Harari et al. | |
| 6,012,064 A | 1/2000 | Gibbons et al. | |
| 6,115,708 A | 9/2000 | Fayyad et al. | |
| 6,304,948 B1 | 10/2001 | Motoyama et al. | |
| 6,449,625 B1 | 9/2002 | Wang | |
| 6,519,604 B1 | 2/2003 | Acharya et al. | |
| 6,988,108 B2 | 1/2006 | Bernhardt et al. | |
| 7,024,401 B2 | 4/2006 | Harper et al. | |
| 7,028,054 B2 * | 4/2006 | Harper et al. ........................ | 1/1 |
| 7,155,560 B2 | 12/2006 | McGrew et al. | |
| 7,203,792 B2 | 4/2007 | Lou et al. | |
| 7,325,052 B1 | 1/2008 | Motoyama | |
| 7,360,096 B2 | 4/2008 | Bracewell et al. | |
| 2006/0072400 A1 * | 4/2006 | Anderson et al. ............ | 369/47.1 |
| 2007/0113029 A1 * | 5/2007 | Bennett et al. ................ | 711/159 |
| 2007/0204141 A1 | 8/2007 | Yamaguchi et al. | |
| 2008/0059540 A1 | 3/2008 | Brown et al. | |
| 2008/0065815 A1 | 3/2008 | Nasu et al. | |
| 2009/0327376 A1 | 12/2009 | Nath et al. | |

FOREIGN PATENT DOCUMENTS

WO    WO2007100197 A1    9/2007

OTHER PUBLICATIONS

Babcock et al., "Models and Issues in Data Streams Systems", © 2002, The ACM Digital Library, pp. 1-16.*
Babcock et al., "Sampling From a Moving Window Over Streaming Data",© 2002, The ACM Digital Library, pp. 1-2.*
Efraimidis et al., "Title: Weighted random sampling with a reservoir", © 2005, Information Processing Letters, pp. 181-185.*

(Continued)

*Primary Examiner* — Rehana Perveen
*Assistant Examiner* — Alexander Khong

(57) ABSTRACT

Systems and methods are provided for online maintenance, processing, and querying of large random samples of data from a large/infinite data stream. In an illustrative implementation an exemplary computing environment comprises at least one data store, a data storage and management engine operable to process and/or store data according to a selected data processing and storage management paradigm on a cooperating data store (e.g., flash media). The exemplary data storage and management engine can deploy the exemplary sampling algorithm to perform and/or provide one or more of the following operations/features comprising the algorithm is operable for streaming data (or a single pass through the dataset), allows for the semi-random data write operations, the algorithm avoids operations (e.g., in-place updates) that are expensive on flash storage media, and the algorithm is tunable to both the amount of flash storage and the amount of standard memory (DRAM) available to the algorithm.

20 Claims, 8 Drawing Sheets

OTHER PUBLICATIONS

LGeDBMS: A Small DBMS for Embedded System with Flash Memory. In: VLDB '06, Sep. 12-15, 2006, Seoul, Korea. VLDB Endowment, ACM 1-59593-385-9/06/09 http://delivery.acrworg/10.1145/1170000/1164257/p1255-kim.pdf?key1=1164257&key2=5397699021&coll=GUIDE&dl=GUIDE&CFID=26547420&CFTOKEN=28440434. Last accessed May 6, 2008, 4 pages.

Manku, et al. Random Sampling Techniques for Space Efficient Online Computation of Order Statistics of Large Datasets http://infolab.stanford.edu/~manku/papers/99sigmod-unknown.pdf. Last accessed May 6, 2008, 12 pages.

Vitter. Faster Methods for Random Sampling. In: Communications of the ACM, vol. 27, No. 7, Jul. 1984. http://delivery.acm.org/10.1145/10000/893/p703-vitter.pdf?key1=893&key2=2167400121&coll=GUIDE&dl=GUIDE&CFID=66710057&CFTOKEN=22351570. Last accessed May 7, 2008, 16 pages.

Bash, et al. Approximately Uniform Random Sampling in Sensor Networks. Proceedings of the First Workshop on Data Management for Sensor Networks (DMSN 2004), Toronto, Canada, Aug. 30, 2004. http://www.cs.bu.edu/fac/byers/pubs/randomsampling.pdf. Last accessed May 6, 2008, 8 pages.

Jermaine. Online Random Shuffling of Large Database Tables. IEEECS Log No. TKDE-0221-0605, IEEE Transactions on Knowledge and Data Engineering, vol. 19, No. 1, Jan. 2007. http://ieeexplore.ieee.org/iel5/69/4016508/04016516.pdf?tp=&isnumber=&arnumber=4016516. Last accessed May 6, 2008, 12 pages.

Birrell, et al. A Design for High-Performance Flash Disks. In: ACM Operating Systems Review, 41(2), Apr. 2007. Last accessed May 7, 2008, 6 pages.

Jermaine, et al. A Novel Index Supporting High Volume Data Warehouse Insertions. In: Proceedings of the 25th VLDB Conference, Edinburgh, Scotland, 1999. Last accessed May 7, 2008, 12 pages.

Vitter. An Efficient Algorithm for Sequential Random Sampling. In: ACM Transactions on Mathematical Software, vol. 13, No. 1, Mar. 1987, pp. 58-67. Last accessed May 7, 2008, 10 pages.

Wu, et al. An Efficient R-Tree Implementation over Flash—Memory Storage Systems. GIS'03, Nov. 7-8, 2003, New Orleans, Louisiana, USA, ACM 1-58113-730-3/03/0011. Last accessed May 7, 2008, 8 pages.

Ganguly, et al. Bifocal Sampling for Skew-Resistant Join Size Estimation. In: SIGMOD'96, Montreal, Canada. ACM 0-89791-794-4/96/0006. Last accessed May 7, 2008, 11 pages.

Mathur, et al. Capsule: An Energy-Optimized Object Storage System for Memory-Constrained Sensor Devices. In: SenSys'06, Nov. 1-3, 2006, Boulder, Colorado, USA. ACM 1-59593-343-3/06/0011. Last accessed May 7, 2008, 14 pages.

Lee, et al. Design of Flash-Based DBMD: An In-Page Logging Approach. In: SIGMOD'07, Jun. 12-14, 2007, Beijing, China. ACM 978-1-59593-686-8/07/0006. Last accessed May 7, 2008, 12 pages.

Babcock, et al. Dynamic Sample Selection for Approximate Query Processing. Last accessed May 7, 2008, 12 pages.

Gibbons, et al. Estimating Simple Functions on the Union of Data Streams, Nov. 10, 2000. Last accessed May 7, 2008, 13 pages.

Jain, et al. Exploiting Mobility for Energy Efficient Data Collection in Wireless Sensor Networks. Published online: Apr. 28, 2006. Last accessed May 7, 2008, 13 pages.

Nath, et al. FlashDB: Dynamic Self-tuning Database for NAND Flash. In: IPSN'07, Apr. 25-27, 2007, Cambridge, Massachusetts, USA. ACM 978-1-59593-638-7/07/0004. Last accessed May 7, 2008, 10 pages.

Ganti, et al. ICICLES: Self-tuning Samples for Approximate Query Answering. In: Proceedings of the 26th VLDB Conference, Cairo, Egypt, 2000. Last accessed May 7, 2008, 12 pages.

Hellerstein, et al. Informix under Control: Online Query Processing. In: Data Mining and Knowledge Discovery, 12, 281-314, 2000. Last accessed May 7, 2008, 34 pages.

Zeinalipour-Yazti, et al. MicroHash: An Efficient Index Structure for Flash-Based Sensor Devices. Last accessed May 7, 2008, 14 pages.

Hachman. New Samsung Notebook Replaces Hard Drive With Flash, May 23, 2006. Last accessed May 7, 2008, 4 pages.

Jermaine, et al. Online Maintenance of Very Large Random Samples. In: SIGMOD 2004, Jun. 13-18, 2004, Paris, France. ACM 1-58113-859-8/04/06. Last accessed May 7, 2008, 12 pages.

Chaudhuri, et al. Overcoming Limitations of Sampling for Aggregation Queries. Last accessed May 7, 2008, 9 pages.

Olken, et al. Random Sampling from Hash Files. ACM 089791-365-5/90/0005/0375. Last accessed May 7, 2008, 12 pages.

Vitter. Random Sampling with a Reservoir. In: ACM Transactions on Mathematical Software, vol. 11, No. 1, Mar. 1985, p. 37-57. Last accessed May 7, 2008, 21 pages.

Diao, et al. Rethinking Data Management for Storage Centric Sensor Networks. Last accessed May 7, 2008, 11 pages.

Miller. SimpleTech announces 512GB and 256GB 3.5-inch SSD drives, posted Apr. 18, 2007. Last accessed May 7, 2008, 3 pages.

Pugh. Skip Lists: A Probabilistic Alternative to Balanced Trees. Last accessed May 7, 2008, 8 pages.

Douglis, et al. Storage Alternatives for Mobile Computers. Last accessed May 7, 2008, 33 pages.

O'Neil, et al. The Log-Structured Merge-Tree (LSM-Tree). Last accessed May 7, 2008, 32 pages.

Understanding the Flash Translation Layer (FTL) Specification, Dec. 1998, AP-684. Last accessed May 7, 2008, 20 pages.

Paulson. Will Hard Drives Finally Stop Shrinking? Computer, Technology News, May 2005. Last accessed May 7, 2008, 3 pages.

Zeus-IOPS Solid State Drives Surge to 512GB in Standard 3.5" Form Factor; Offer Unprecedented Performance for Enterprise Computing. Published Apr. 18, 2007. http://www.primenewswire.com/newsroom/news.html?d=117. Last accessed May 7, 2008, 3 pages.

Nath, S. et al.; "Online Maintenance of Very Large Random Samples on Flash Storage"; Proceedings of the VLDB Endowment; vol. 1, No. 1; Aug. 2008; pp. 970-983.

"Using Total Recall"; http://www.oracle.com/technology/obe/11gr_db/security/flada/flada.htm; Oracle Technology Network; Last accessed Apr. 30, 2008; 8 pages.

Peterson, M.; "ILM and Tiered Storage"; http://www.snia.org/forums/dmf/knowledge/DMF-SNS_Tiered_Storage_20051024.pdf; Oct. 2005; 3 pages.

Gemulla, et al.; "A Dip in the Reservoir: Maintaining Sample Synopses of Evolving Datasets"; VLDB '06; Sep. 12-15, 2006; Seoul, Korea; 12 pages.

* cited by examiner

US 8,352,519 B2

MAINTAINING LARGE RANDOM SAMPLE WITH SEMI-RANDOM APPEND-ONLY OPERATIONS

CROSS-REFERENCE TO RELATED APPLICATIONS

This application is related to U.S. patent application Ser. No. 12/165,466, filed Jun. 30, 2008, entitled "B-File ABSTRACTION FOR EFFICIENTLY ARCHIVING SELF-EXPIRING DATA", the entirety of which is incorporated herein by reference.

BACKGROUND

Recent technological trends in flash media have made it an attractive alternative for data storage in a wide spectrum of computing devices such as PDA's, mobile phones, embedded sensors, MP3 players, etc. The success of flash media for these devices is due mainly to its superior characteristics such as smaller size, lighter weight, better shock resistance, lower power consumption, less noise, and faster read performance than disk drives. While flash-memory has been the primary storage media for embedded devices from the very beginning, there is an increasing trend that flash memory will infiltrate the personal computer market segment. As its capacity increases and price drops, flash media can overcome adoption as compared with lower-end, lower-capacity magnetic disk drives.

Current technology allows for running a full database system on flash-only computing platforms and running a light-weight database system on flash-based embedded computing devices. However, flash has fundamentally different read/write characteristics from other non-volatile media such as magnetic disks. In particular, flash writes are immutable and once written, a data page must be erased before it can be written again. Moreover, the unit of erase often spans multiple pages, further complicating storage management. With current practices, these unique characteristics can be hidden from applications via a software layer called the Flash Translation Layer (FTL), which enables mounting and using a flash media like a disk drive. Using the FTL, conventional disk-based database algorithms and access methods will function correctly without any modification.

However, since the FTL needs to internally deal with flash characteristics, many algorithms designed for magnetic disks are not likely to yield the best attainable performance. For example, algorithms that overwrite data in place may work well with magnetic disks, but will perform poorly with flash media. Thus, in order to make a flash-based storage systems efficient, many algorithms need to be redesigned to take flash characteristics into account.

As a specific example, consider maintenance of a very large (e.g., several gigabytes) random sample of an evolving data stream. In this context, random sampling is a approximation technique used in many applications including data mining, statistics, and machine learning. In many scenarios, the sample needs to be very large to be effective. For example, when the underlying data has a high variance, a very large sample is required to provide accurate estimates with suitably high confidence. Moreover, variance in the data is often magnified by standard database operators like selections and joins, increasing the size of the sample required to ensure a target approximation accuracy.

Another example is sensor networks, where each sensor collects too many readings to store all of them in its limited storage, and transmitting all its readings to a base station expends too much of its limited battery. In such a case, it is desirable for the sensor to maintain a random sample of its readings. Operatively, queries can be pushed to the sensor nodes, and answered using the sample points falling within a specified time window. Humans or data mules traveling next to a sensor node can be used to retrieve its sample for offline data mining or statistical analysis purposes; while such mules minimize the energy cost of retrieving data, they typically pass by a sensor node far too infrequently to collect more than a sample of its readings. It is desirable that the sample maintained on the sensor node is large (in many cases, as large as possible) because (i) scientists deploying the sensors usually want to collect as much data as possible, and (ii) a very large sample helps ensure that there will be a sufficient number of sample points within every time-window of interest.

However, currently deployed sampling algorithms are lacking since they do not offer one or more of the following properties, the algorithm is suitable for streaming data, or any similar environment where a large sample must be maintained online in a single pass through the dataset; the algorithm must be efficient, in terms of latency or energy, on flash; i.e., it should be flash-aware and it should avoid operations (e.g., in-place updates) that are expensive on flash; and the algorithm should be tunable to both the amount of flash storage and the amount of standard memory (DRAM) available to the algorithm. Thus, the algorithm can be tunable to a specified bounded sample size, and DRAM-constrained embedded devices can use the algorithm, while less constrained devices can take advantage of the larger available DRAM.

For example, reservoir-sampling and geometric file are two algorithms for maintaining a bounded size sample. Both can be implemented to maintain a sample on flash media, but both require many in-place updates on flash and, hence, are very slow and energy expensive in flash. Moreover, geometric file has a large DRAM footprint, and hence is not suitable for most embedded systems.

From the foregoing it is appreciated that there exists a need for systems and methods to ameliorate the shortcomings of existing practices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The subject matter described herein allows for systems and methods to for data processing and storage management. In an illustrative implementation an exemplary computing environment comprises at least one data store operative to store one or more data elements, a data storage and management engine, and at least one instruction set to instruct the data processing and storage engine to process and/or store data according to a selected data processing and storage management paradigm. In the illustrative implementation, the data processing and storage management paradigm allows for the storage of data according using a selected tuned sampling algorithm.

In an illustrative operation, the exemplary data storage and management engine can deploy the exemplary sampling algorithm to perform and/or provide one or more of the following operations/features comprising the algorithm is operable for streaming data (or a single pass through the dataset), the algorithm avoids operations (e.g., in-place updates) that are expensive on flash storage media, the algorithm utilized semi-random writing of data on cooperating flash media, and the algorithm is tunable to both the amount of flash storage and the amount of standard memory (DRAM) available to the algorithm. In the illustrative operation, data can be received by the exemplary data storage and management engine and can be processed by the exemplary selected tuned sampling algorithm to store data on a cooperating storage media (e.g., flash storage media) according to the properties/features/operations of the exemplary algorithm.

The following description and the annexed drawings set forth in detail certain illustrative aspects of the subject matter. These aspects are indicative, however, of but a few of the various ways in which the subject matter can be employed and the claimed subject matter is intended to include all such aspects and their equivalents.

DETAILED DESCRIPTION

Figure 1:
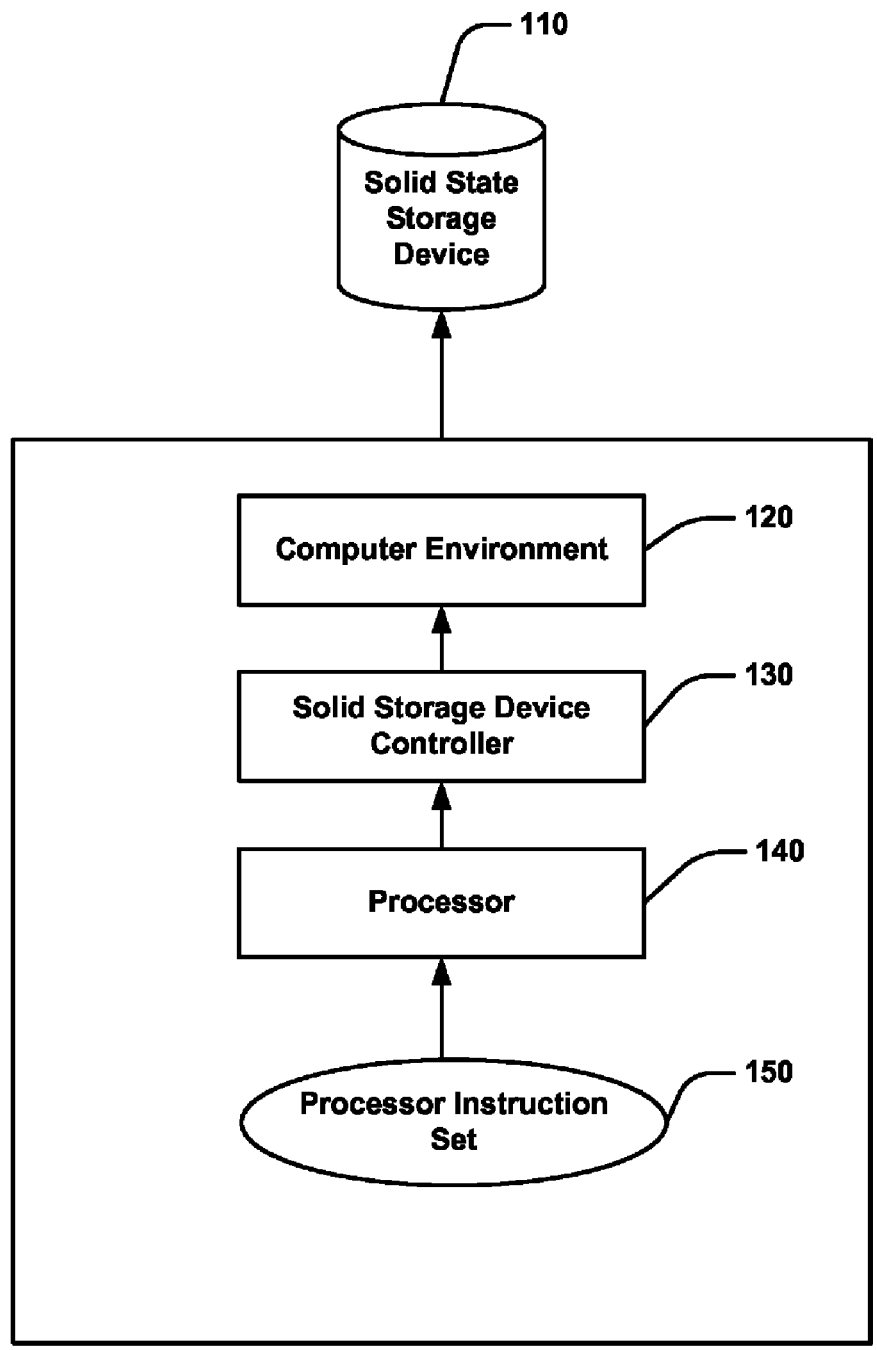
FIG. 1 is a block diagram of one example of an exemplary computing environment in accordance with the herein described systems and methods.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative illustrations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

Flash Storage Media Overview:

Flash storage is generally available in three major forms: flash chips, flash cards, and solid state disk (SSD) drives. Flash chips are primarily of two types: NOR and NAND. While NOR flash has faster and simpler access procedures, its storage capacity is lower and hence it is used primarily for program storage. NAND flash offers significantly higher storage capacity (e.g., currently 4 GB in a single chip) and is more suitable for storing large amounts of data. The key properties of NAND flash that directly influence storage design are related to the method in which the media can be read or written.

With flash media, all read and write operations happen at page granularity (or for some chips down to ⅛ th of a page granularity), where a page is typically 512-2048 bytes. Pages are organized into blocks, typically of 32 or 64 pages. A page can be written only after erasing the entire block to which the page belongs. However, once a block is erased, all the pages in the block can be written once with no further erasing. Page write cost (ignoring block erase) is typically higher than read, and the block erase requirement makes some writes even more expensive. A block wears out after 10,000 to 100,000 repeated writes, and so the write load should be spread out evenly across the chip. Because there is no mechanical latency involved, random read/write is as fast as sequential read/write (assuming the writes are for erased pages).

Flash cards such as compact flash (CF) cards, secure digital (SD) cards, mini SD cards, micro SD cards and USB sticks provide a disk-like ATA bus interface on top of flash chips. The interface is provided through a Flash Translation Layer (FTL), which emulates disk-like in-place update for a (logical) address L by writing the new data to a different physical location P, maintaining a mapping between each logical address (L) and its current physical address (P), and marking the old data as dirty for later garbage collection.

Thus, although FTL enables disk-based applications to use flash without any modification, it needs to internally deal with flash characteristics (e.g., erasing an entire block before writing to a page).

SSD drives are high capacity (512 GB SSD ones now available) flash packages that use multiple flash chips in parallel to improve read/write throughput. Like flash cards, they use an FTL, and hence suffer from the same performance problems for random writes. Further, write operations often consumes more energy than erase because the duration that power is applied while writing a bit is extended in order to ensure the bit is written.

There are a number of flash media operative principles that can be exploited by the herein described systems and methods to overcome the shortcomings of existing practices. For example, a first principle (e.g., Principle 1) considers: Deleting items in batch and clustering items to delete together in as few blocks as possible. Deleting data in a flash requires a block erase operation. Before erasing a block, valid data in the block needs to be copied to some other location, which requires reading and writing all the valid data. The amortized cost of deleting an item can be made orders of magnitude smaller by deleting multiple items with a single erase operation. This can be done by clustering data that will be deleted together in the same block.

A second principle (e.g., Principle 2) considers: Avoiding updating data already written to flash. Appending data is preferred than updating data since flash does not allow updating data in place. Updating some in-flash data d involves several steps: (a) all other data d' from the flash block b containing d first needs to be moved to other locations, (b) the page containing d is read and modified in memory, (c) block b is erased, and (d) d' and the modified d are written back to b. In contrast, appending data to flash is cheap, because it can be done by erasing a block and sequentially writing to it until the block is full, without requiring any data movement.

A third principle (e.g., Principle 3) considers: Allocating and deallocating storage space in granularity of blocks. Possible choices for an allocation/deallocation size include: (i) sub-page granularity, where fractions of a single flashpage are allocated independently (i.e., the same flash page can contain multiple independent data units), (ii) page granularity, where each entire page is allocated independently, and (iii) block granularity, where each entire flash block is allocated independently.

As allocated units are deallocated, storage space is freed up. However, reusing deallocated space requires an erase operation on flash. In sub-page and page-level allocations, other data units that reside within a page or the erase block may still contain valid data, and thus, must be moved elsewhere before the entire block can be erased and reused.

A fourth principle (e.g., Principle 4) considers: Avoiding random writes in flash cards. A flash chip is an electronic device exclusively and thus has no mechanically moving parts like disk heads in a magnetic disk drive. Therefore, a raw flash memory chip can provide similar sequential and random access speed. For flash cards and SSD drives (or flash chips with a software FTL driver): such devices provide very poor random write performance. For example, random writes on an exemplary CF card is over two orders of magnitude more expensive than sequential writes. The performance problem stems from an artifact of the FTL design. The FTL maintains a mapping table between logical addresses and physical addresses. If this table were to map logical pages to physical pages, the mapping table for a 2 GB flash would be 64 MB. Instead, existing flash packages maintain a mapping from logical blocks to physical blocks; for a 2 GB flash, this reduces the mapping table to 1 MB.

Such property enables the mapping table to be stored in memory. However, with block-level mapping, even when a single page is modified, the whole logical block needs to be written to a new physical block. FTLs in existing flash cards avoid some of the costs by being lazy; when the i'th logical page of a block is written, the FTL moves and writes the first i pages to a newly allocated block, leaving subsequent pages in the old block; later, when page j>i is modified, pages (i+1) to j are moved and written to the new block, and so on.

Aside from traditional sequential and random access patterns, semi-random access pattern where individual flash blocks are selected in any order can be deployed, but individual pages within blocks are written sequentially. For example, an application can write pages in the following semi-random pattern, indicated by a sequence of (block id, page id) pairs: (1,1), (1,2),(10,1), (3,1), (1,3), (3,2), (10,2),(1, 4) etc. In this example, within block 1, pages are accessed in sequence 1, 2, 3, 4, etc., however, sequential writes within different blocks are interspersed with each other. The performance of semi-random writes (here blocks are selected at random) is very close to that of sequential writes and improves upon random write operations. This is due to the block-level mapping and lazy movement of data in existing FTLs. Further, some applications may be able to utilize random writes with semi-random writes.

A fifth (e.g., Principle 5) considers: Minimizing (DRAM) memory footprint. Today's flash-based computing platforms vary widely in the size of available memory (DRAM)—from as few as several kilobytes (e.g., low-end embedded sensors) to many megabytes (e.g., high-end sensors, PDAs) to several gigabytes (e.g., laptops). For generality, the herein described systems and methods illustratively deploy an algorithm that is operative to optimize for stringent memory constraints, and exploits greater memory availability in order to improve latency and energy-efficiency.

The Sampling Algorithm:

The following illustrative algorithm shows exemplary pseudocode for an exemplary sampling algorithm utilized by the herein described systems and methods.

```
1:  L ← 0 /* L is the current minimum active level */
2:  for each new item v do
3:     l_v ← Level (v, s_min, s_max) /* compute the level of the item */
4:     if (l_v ≥ L) then /* if v selected for the sample*/
5:         Add v to sample
6:         If (sample size = s_max) then
7:             Discard all items with level L from sample
8:             L ← L + 1
9:     endif
10: endif
11: endfor
```

The exemplary algorithm comprises various properties. For example, the algorithm will incur some additional storage overhead beyond the sample itself, in order to improve performance. The sample size can maintain a range between a specified lower bound ($s_{min}$) and a specified upper bound ($s_{max}$). This flexibility is useful because it enables the decoupling of the addition of a new item to the sample from the deletion of an existing item (to make room). Illustratively, the difference between $s_{max}$ and $s_{min}$ can represent the additional flash storage overhead incurred by the exemplary algorithm to ensure (on expectation) a sample of size at least $s_{min}$. Further, since the maintained sample maintains uniform randomness, any extra sample points beyond $s_{min}$ do not contribute to inefficiency, since such sample points can utilized by one or more cooperating applications.

Another property of the exemplary algorithm considers that when an item is selected for the sample, its relative priority is determined for deletion compared to other sample points (i.e., its random relative replacement order can be preselected), and then store the item with sample points of the same priority. Specifically, each item selected for the sample can be randomly assigned to one of a logarithmic number of "levels" (by the "Level" function in line 3 of the algorithm, details below). This partitions the sampled items into equivalence classes; all items in the same equivalence class can be stored in the same "bucket" and can later get discarded at the same time. This allows block-wise erasure (as opposed to random overwrite) of data. In an illustrative implementation, a B-File data structure can be utilized to store the items in buckets.

Another algorithm property considers the use of same Level function and a rising threshold L to determine whether an item is selected for the sample. Consider the main loop of Algorithm 1. An item v is selected if its level $l_v$ is at least the current threshold L. A selected item can be added to the bucket for its level. Whenever the sample size reaches $s_{max}$, storage space can be achieved by discarding all the sample points in the largest bucket, i.e., discarding all items with level L but retaining all items with level L+1 or above. Conceptually, all the buckets can then be shifted to the left, so that the buckets containing sample points are always numbered starting at 1. Since any items with level L are not considered in the sample, but require at least level L+1, we increment the threshold.

Illustratively, the fact that all items in unexpired buckets constitute a random sample holds as long as the random variable that determines an item's level is independent of its arrival order. As a specific implementation, and in order to have only a logarithmic number of levels, items to levels can be assigned such that the expected number of items having a level i decreases exponentially with i. Such a random level can be obtained by tossing a biased coin—the level is determined by the number of tosses required to get the first head. Let p be the probability of heads on any given coin toss. Then it can be shown that at any point of time, the items with level$\geq$L (i.e., the items in the sample), represent a uniform sample of all the items already processed.

Data Storage and Management Operations and Features Overview:

With current practices, an exemplary data storage engine can operate to extract a subsample Q from the sample S generated by an exemplary data sampling algorithm dependent on various parameters including size of the original sample (i.e., process smaller sub-samples of the original sample to promote various efficiencies—power, processing, etc.) and time window (e.g., arbitrary time window). A random sample Q from the on-flash sample S can be selected such that |Q|<|S|. With such practices, the random sampling can be realized by utilizing an exemplary reservoir sampling algorithm to draw a sample of size |Q| from S. Because S is a random sample of the stream, Q chosen by reservoir sampling can be considered a random sample of the stream as well. However, such approach can result in drawbacks. First, such sampling operation can require scanning the entire sample S, which can be as large as several gigabytes. Second, such sampling operation could require O(|Q|) space in the memory, which may not be feasible in many memory-constrained devices.

The herein described systems and methods aim to ameliorate the shortcomings of existing practices by providing, in an illustrative implementation, iterative sampling. Illustratively, it can be supposed that the sample is maintained with a data structure that is operative to retain data items with different levels in separate buckets (e.g., according to an exemplary deployment of a B-File). In the illustrative implementation, a sample point can be extracted from S at a time (i.e., |Q|=1), with replacement. An exemplary iterative sampling algorithm can perform the following acts:

```
1: while true do
2:     r = RAND(1, N + 1)
3:     j = RAND(1, b* ) {b* is the size of the largest bucket}
4:     if (j ≤ |B_r| ) then
5:         Return the j 'th item in B_r
6:     endif
7: endwhile
```

Illustratively, an estimator can use iterative sampling until a selected accuracy is achieved, adapting to the variance in the sampled data (e.g., the lower the variance, the smaller the required sample size). In an alternate illustrative implementation, batch sampling (i.e., |Q|>>1), can be deployed. Given that the sample is stored in a data structure that keeps items of different levels in separate buckets, the following exemplary algorithm can be used for batch sampling of size |Q|. First, select a few buckets $\{B_1, B_2, \ldots, B_k\}$, such that $$\sum_{i=1}^{k} |B_i| \geq |Q| \text{ and } \sum_{i=1}^{k-1} |B_i| < |Q|$$

(|B| is the size of bucket B). That is, only a fraction of the last bucket $B_k$ needs to be selected to have |Q| items in all. Second, sample Q', a random set of $$\left(|Q| - \sum_{i=1}^{k-1} |B_i|\right)$$

items, from Bk, using reservoir sampling. Finally, return $$Q = \left(\sum_{i=1}^{k-1} B_i \cup Q'\right)$$

as the target sample. Illustratively, a batch is a uniform sample without replacement. Additionally, the herein described systems and methods can perform sampling within a selected time window.

In an illustrative implementation, given an arbitrary $t_1$ and $t_2$ at query time, $t_1 < t_2$, a random sample of the items in the part of the original stream that arrived within the time window can be returned. In the illustrative implementation, exemplary buckets can be stored in a B-File abstraction in descending timestamp order. In an illustrative operation, an exemplary data structure can operatively locate, for a bucket, a recent stored item $I_0$ with a timestamp$\leq t_2$. The bucket can then be sequentially scanned to find items with timestamps$\geq t_1$. In the illustrative implementation, to locate $I_0$, blocks within a bucket can be organized as a skip list.

Illustratively, a skip list can be considered an ordered linked list with additional forward links, in an illustrative implementation, added randomly with a geometric/negative binomial distribution, such that an exemplary search in the list can operatively skip parts of the list. Illustratively, blocks in a bucket of an exemplary B-File can be inserted at the front of the bucket and inserting a new node at the front of a skip list. Illustratively, an exemplary algorithm can be used to insert a new block at the front of a bucket. In memory, a bucket can maintain a header that keeps maxLevel number of forward pointers. (e.g., "level" can refer to the skip list pointers). To insert a block into the list, a level, lvl, can be generated for the block such that blocks have level≧1, and a fraction p of the nodes with level≧i have level≧(i+1). Illustratively, for level i, the bucket header can maintain a recent stored block with level≧i. For each level i up to lvl, the new block can operatively copy the level i pointer from the bucket header into its level i pointer and then can write a pointer to itself as the new level i pointer in the bucket header. Inserting a block can be accomplished by writing to the bucket header and a selected page (e.g., first page) of a new block (e.g., both of which can be stored in memory).

In the illustrative operation, items within a selected time window can be searched illustratively by performing a skip search and/or a binary search. Skip search can be used to locate the flash block containing $I_0$. In the illustrative operation, starting from the header of the bucket, a block can be searched by traversing forward pointers that do not overshoot the block containing the item with timestamp t2 (e.g., items are sorted in descending order of timestamps). When no more progress can be made at the current level of forward pointers, the search can then move down to the next level. After a block is located, binary search can be illustratively performed to locate the page that contains the a recent stored item with timestamp≦$t_2$. Illustratively, after locating the page, subsequent pages can be read sequentially from the same block. If the last page of the block does not contain a timestamp<$t_1$, the read continues from the first page of the next block of the bucket (e.g., the pointer forward of a block can give the next block of the bucket). The illustrative scan can then halt upon encountering an item having a timestamp<t1.

In an illustrative implementation, an item i can maintain a weight $w_i$ and can be assigned a level $l_w = l_u + \log(1-p) w_i$. An exemplary algorithm in accordance with the herein described systems and methods, (e.g., an exemplary sampling algorithm) can maintain a sample such that, the probability that the item i is included in the sample S is proportional to $w_i$.

The herein described systems and methods also consider the probability of an item to be included in the sample decays with its age; i.e., at any point in time, the sample includes more new items than old items. For example, with sensor data management—most queries can be over recent sensor readings. Another example is sampling-based techniques for network intrusion detection where recent events are more important than older events.

In an illustrative implementation, a sampling algorithm can be utilized by an exemplary data storage and management engine operative such that a recent added item is in the sample and the probability that an item is included in the sample decays exponentially with its age. In the illustrative implementation, age can be described (e.g., $age_i$ of an item i) as the number of items in S' that arrived after $i^2$. With the illustrative time decaying sampling algorithm, the inclusion probability of items can decay in discrete steps. Illustratively, the inclusion probability of items can stay the same for every $s_1$ item arrivals, where $s_1$ can be the expected size of a first bucket B1 in an exemplary B-File (e.g., 305 of FIG. 3). The inclusion probability of an item i can exponentially decrease with the number of item groups of size $s_1$ that arrived after i.

In the illustrative implementation, an exemplary sampling algorithm can generate the levels of for newly arrived items such that on the arrival of an item i, a level $\hat{l}_e = \hat{l}_u + L_i$ can be assigned, where $\hat{l}_u$ is the level generated by an illustrative coin toss experiment for uniform sampling, and $L_i$ can represent the minimum active level at the time of the arrival of item i. For example, suppose an item i is assigned a level $\hat{l}_e = \hat{l}_u + L_i$ where $L_i$ represents the minimum active level at the time of the arrival of item i. An exemplary sampling algorithm can then maintain a sample S such that at any point in time, the probability that item i is included in the sample exponentially decreases with $(L-L_i)$, where L can represent the current minimum active level.

Data Storage And Management Features Deployed On Flash Media:

FIG. 1 describes an exemplary computing environment 100 operable to control and manage data storage on solid state storage (e.g., flash media). As is shown, in an illustrative implementation, exemplary computing environment 100 comprises computer environment 120 and solid state storage device 110. Further, as is shown, computer environment comprises solid storage device controller 130, processor 140, and processor instruction set 150.

In an illustrative operation, computing environment 100 can process data for storage and management on solid state storage device 110. In the illustrative operation, processor 140 of computer environment 120 can process data for storage and management on solid state storage device 110 by executing one or more instructions from processor instruction set 150 allowing for the storage and/or management data on solid state storage device 110 through solid state storage controller 130. Operatively, solid state storage controller 130 directed by processor 140 can store and/or manage data on solid state storage device 110 according to one or more data storage principles applicable to the storage and/or management of data on solid state storage devices.

In an illustrative implementation, exemplary data storage principles include but are not limited to deleting items in batch and cluster items to delete together in as few blocks as possible. Stated differently, deleting data in a solid state storage devices (e.g., flash media) generally requires a block erase operation. That is, before erasing a block, valid data in the block needs to be copied to some other location, which requires reading and writing all the valid data. The amortized cost of deleting an item can be made orders of magnitude smaller by deleting multiple items with a single erase operation. This can be done by clustering data that will be deleted together in the same block.

A second exemplary principle considers updating data already written to flash media. Stated differently, flash media does not allow updating data in place. Another exemplary principle considers allocating and de-allocating storage space in granularity of blocks. Possible choices for an allocation/de-allocation size can include: (i) sub-page granularity, where fractions of a single flash page are allocated independently (i.e., the same flash page can contain multiple independent data units), (ii) page granularity, where each entire page is allocated independently, and (iii) block granularity, where each entire flash block is allocated independently.

Another solid state storage operating principle considers avoiding random writes in flash media. Generally, flash media is an electronic device and thus has no mechanically moving parts like disk heads in a magnetic disk drive. Therefore, a raw flash memory chip can provide similar sequential and random access speed. However, flash media generally provide poor random write performance.

It is appreciated that although solid state storage device 110 is shown to be independent of computer environment 150 that such description is merely illustrative as the inventive concepts described herein also are applicable to a computing environment 100 which includes a solid state storage device/component within a computer environment as well.

Figure 2:
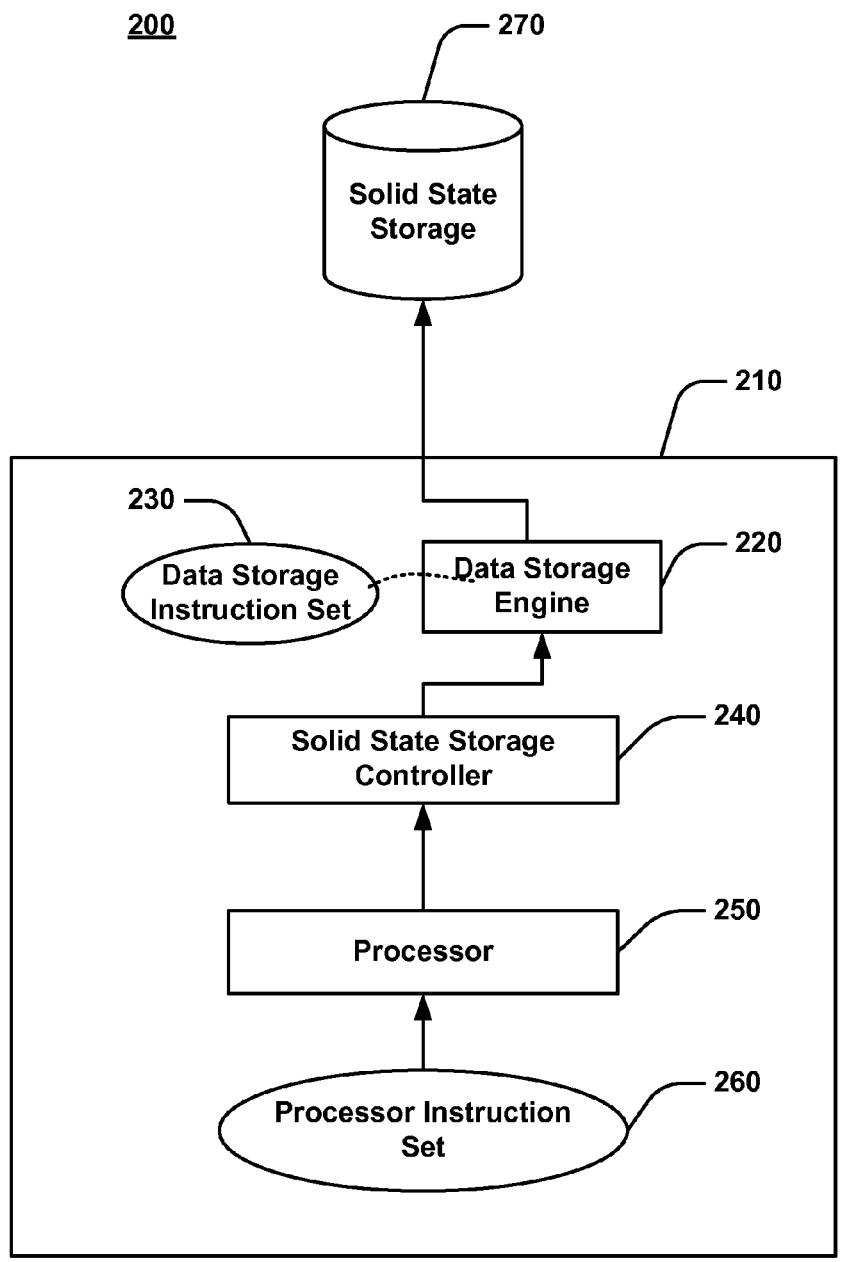
FIG. 2 is a block diagram of one example of an exemplary computing environment deploying B-File memory management in accordance with the herein described systems and methods.

FIG. 2 describes exemplary computing environment 200 operable to control and manage data storage on solid state storage (e.g., flash media). As is shown in FIG. 2, in an illustrative implementation, exemplary computing environment comprises computer environment 210 and solid state storage device 270. Further, as is shown, computer environment 210 comprises processor 250, processor instruction set 260, solid state storage controller 240, data storage engine 220, and B-File engine instruction set 230. In the illustrative implementation, processor 250, solid state storage controller 240, data storage engine 220, and solid state storage device 270 are electronically coupled allowing for the communication of various data and/or instructions for storage and/or execution.

In an illustrative operation, computing environment 200 can process data for storage and management on solid state storage device 270. In the illustrative operation, processor 250 of computer environment 210 can process data for storage and management on solid state storage device 270 by executing one or more instructions from processor instruction set 260 allowing for the storage and/or management data on solid state storage device 270 through solid state storage controller 240, data storage engine 220 operating according to one or more instructions provided by data storage engine instructions set 230. Operatively, solid state storage controller 240 directed by processor 250 can store and/or manage data on solid state storage device 170 according to one or more data storage principles applicable to the storage and/or management of data on solid state storage devices as illustratively provided by data storage engine 220 operating according to one or more instructions provided by data storage engine instruction set 230.

In the illustrative operation, the data storage engine 220 processes one or more instructions from data storage engine instruction set 230 to store data according to selected solid state media (e.g., flash media) data storage and management paradigm utilizing a tuned sampling algorithm. In the illustrative implementation, the tuned sampling algorithm can operatively store the data in a B-File that can comprise a large set of application buckets $\cup_i B_i$ stored on a flash media. Physically, the B-File can illustratively store these buckets in a collection of N "individual" buckets holding the first N application buckets and one "tail" bucket holding all the remaining (typically very small) buckets.

At a high level, the B-File can operatively support the following exemplary operators: new B-File(N): Create a new B-File with N individual B-File buckets plus one tail B-File bucket; AddItem(v,i): Add item v to application bucket $B_i$; size and size(i): Return the number of items in the entire B-File or in application bucket $B_i$; and DiscardBucket(i): Discard the items in application bucket $B_i$, and reclaim the space.

Illustratively, when used in context to a sampling algorithm, the sizes of individual application buckets can operatively exponentially decrease, with the first bucket $B_1$ being the largest. At any point of time, the contents of the buckets can represent the random sample S over the entire data stream S'.

Figure 3:
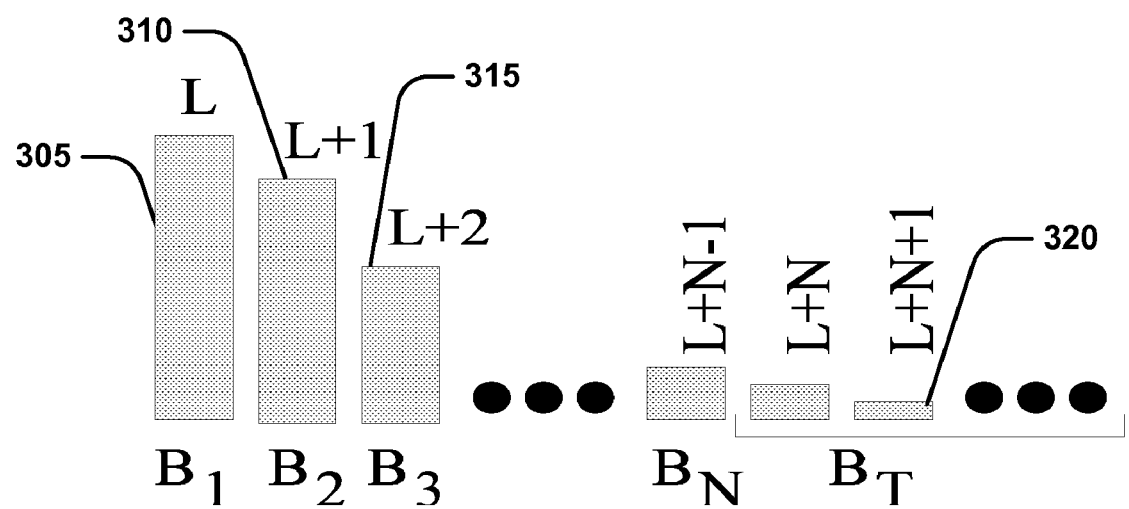
FIG. 3 is a block diagram of an exemplary data file in accordance with the herein described systems and methods.

FIG. 3 depicts an exemplary snapshot of exemplary storage file 300. As is shown in FIG. 3, solid bars 305, 310, 315, up to and including 320, can illustratively represent application buckets. In an illustrative implementation, text above a bar can represent the level of the items in the buckets 305, 310, 315, up to and including 320, and text below a bucket can illustratively represent the B-File bucket number. In the illustrative implementation, the tail B-File bucket $B_T$ can illustratively contain items with a selected threshold level (e.g., level L+N).

Figure 4:
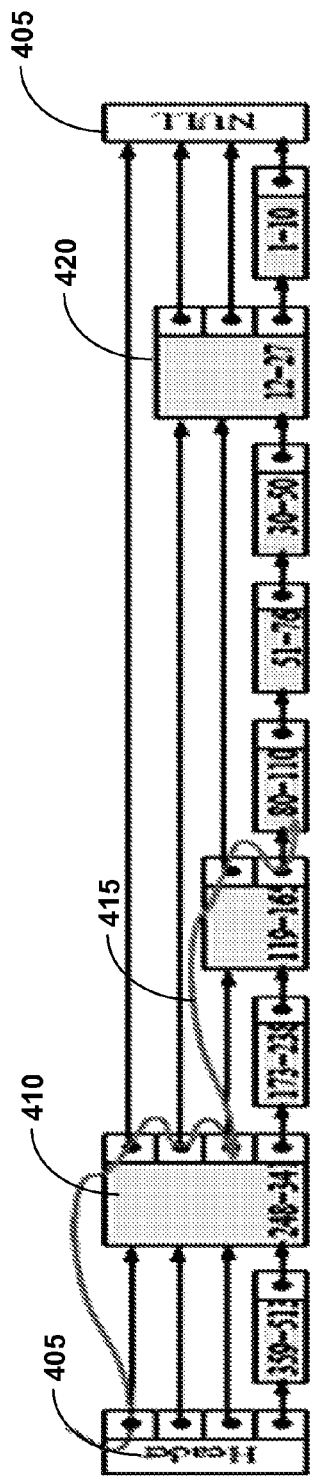
FIG. 4 is a block diagram of data storage blocks being stored in accordance with the herein described systems and methods.

FIG. 4 depicts an exemplary physical layout of exemplary B-File buckets (e.g., 305, 310, 315, up to and including 320 of FIG. 3). As is shown in FIG. 4, B-File 400 section 405 illustratively describes the header portion of the B-File bucket. In an illustrative implementation, for a B-File bucket, an in-memory data structure called the header can be maintained by the exemplary B-File 400. The header can illustratively cooperate with various data blocks 410, 415, and 420 having descending time stamps (as is shown).

In an illustrative operation, when an item is added to a bucket, data can be written to the blocks 410, 415, and 420. When the page buffer not shown holds one page worth of data, the buffer is flushed to the next available page within the block pointed to by the block pointer. Search or retrieval of items in a bucket starts with the block pointer. In the illustrative implementation, an exemplary B-File engine (e.g., 220 of FIG. 2) can illustratively write in-memory buffers to flash pages. When the buffer holds one page worth of data, the buffer can be flushed to the next available page within the block h pointed by the block pointer. When no empty page is available in that block h, a new block h' is allocated by the exemplary B-File engine.

A pointer (not shown) to the block h can be stored at the end of block h' and the block pointer is updated to h'. In the illustrative implementation, the blocks in a bucket can be chained together with backward pointers and the address of the last block is maintained in the block pointer. Further, in the illustrative implementation, an exemplary B-File engine can keep track of available blocks and allocate them on demand. When the B-File engine discards a bucket, the block pointer of the bucket can be returned.

In the illustrative implementation, the size of exemplary B-File 400 can fluctuate between two user-specified bounds $s_{min}$ and $s_{max}$. In the illustrative implementation, there can exist a non-trivial interaction between the cost of maintaining samples in a B-File, and the difference $\delta = s_{max} - s_{min}$. Illustratively, a large value of $\delta$ is not desirable, since buckets are discarded less frequently and more items are added to the B-File (some of which are discarded later). Illustratively, a small value of $\delta$ is not desirable either, because then the tail bucket can contain a large number of items, increasing the cost of log unroll.

Figure 5:
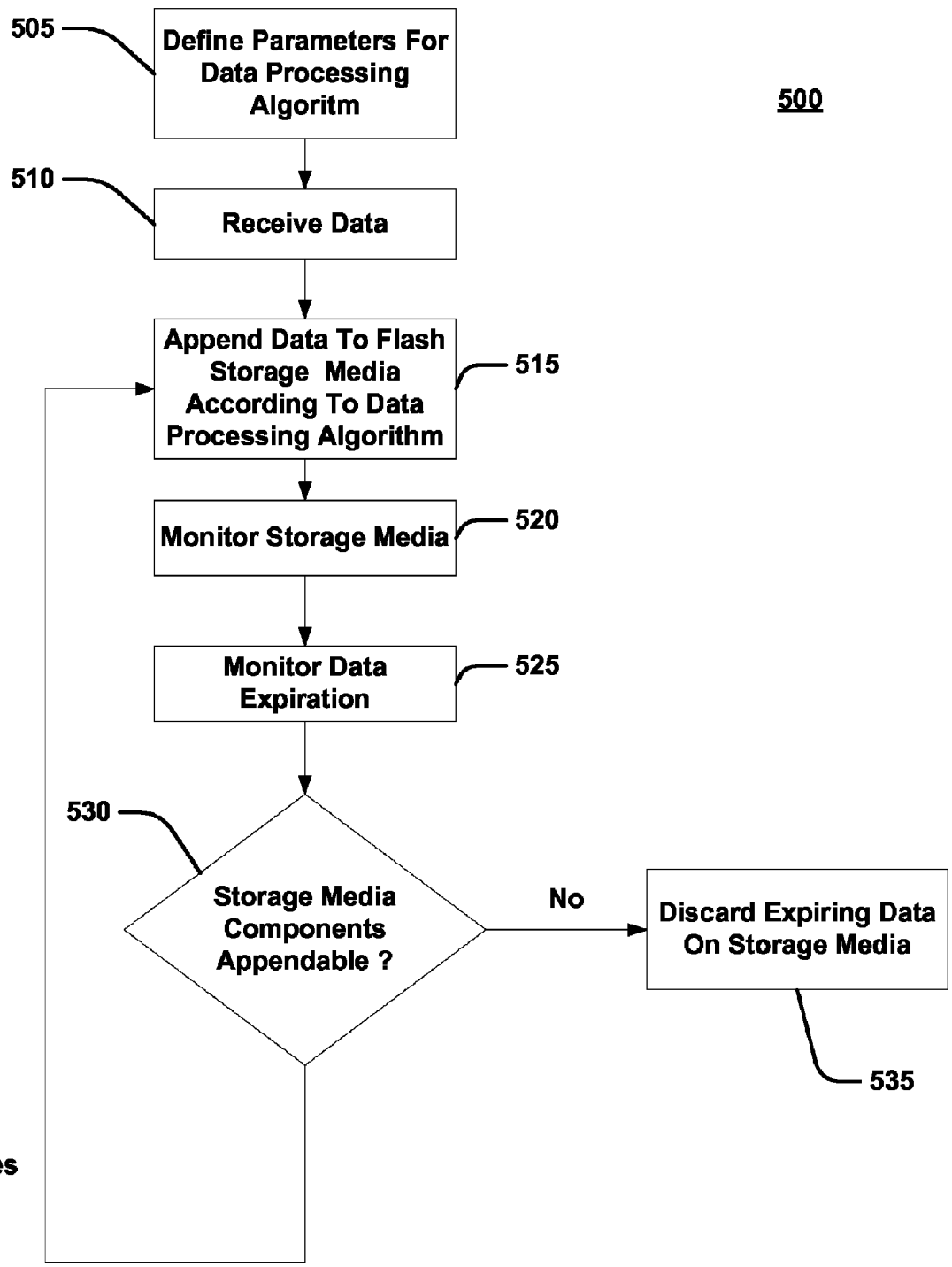
FIG. 5 is a flow diagram of an exemplary method performed for memory management in accordance with the herein described systems and methods.

It is appreciated that the although the sampling algorithm is described to operatively store data using an exemplary B-File that such description is merely illustrative as the herein described systems and methods are operative to deploy a sampling algorithm capable of storing data in various data storage formats other than a B-File FIG. 5 is a flow diagram of an exemplary method 500 for managing and/or storing data. As is shown, processing begins at block 505 where parameters for an exemplary data processing algorithm are defined. Processing then proceeds to block 510 where data is received. From there, data can then be appended to the flash storage media according to the data processing algorithm at block 515. Processing then proceeds to block 520 where the storage media is monitored. Also expiring data is monitored at block 525. Processing then proceeds to block 530 where a check is performed to determine if the storage media components can take on more data.

If the check at block 530 indicates that the storage media components can not take on more data as determined by the data processing algorithm, processing proceeds to block 535 where the expiring data on the storage media is discarded according to one or more features and/or operations of the data processing algorithm. However, if the check at block 530 indicates that the storage media components can take on more data, reverts to block 515 and proceeds from there.

Figure 6:
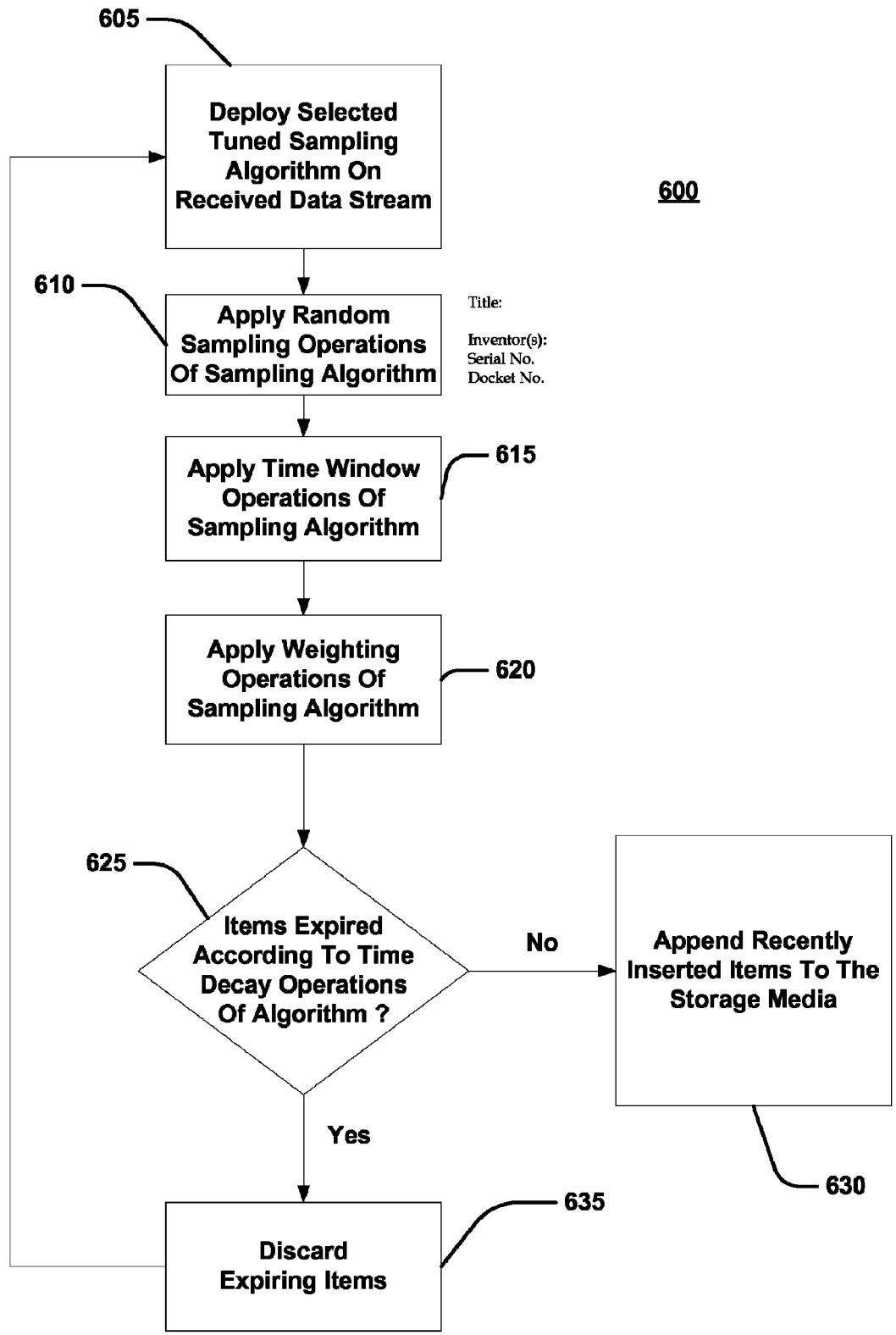
FIG. 6 is a flow diagram of another exemplary method performed for B-File abstraction in accordance with the herein described systems and methods.

FIG. 6 is a flow diagram of an exemplary method 600 to append data according the deployment of a selected tuned sampling algorithm for processing a data stream. Processing begins at block 605 where a selected tuned sampling algorithm is deployed. Processing then proceeds to block 610 where one or more random sampling operations of the sampling algorithm are applied. Processing then proceeds to block 615 where one or more time window operations of the sampling algorithm are applied. From there, weighting operations of the sampling algorithm are applied at block 620.

A check is then performed at block 625 to determine if one or more items have expired according to one or more time decay operations of the sampling algorithm. If the check at block 625 indicates that there are no expired items, processing proceeds to block 630 where the recently sampled items are appended to the storage media (e.g., appended to blocks of one or more buckets of an exemplary B-File). However, if the check at block 625 indicates that there are expiring items, processing proceeds to block 635 where the expiring items are discarded.

The methods can be implemented by computer-executable instructions stored on one or more computer-readable media or conveyed by a signal of any suitable type. The methods can be implemented at least in part manually. The steps of the methods can be implemented by software or combinations of software and hardware and in any of the ways described above. The computer-executable instructions can be the same process executing on a single or a plurality of microprocessors or multiple processes executing on a single or a plurality of microprocessors. The methods can be repeated any number of times as needed and the steps of the methods can be performed in any suitable order.

The subject matter described herein can operate in the general context of computer-executable instructions, such as program modules, executed by one or more components. Generally, program modules include routines, programs, objects, data structures, etc., that perform particular tasks or implement particular abstract data types. Typically, the functionality of the program modules can be combined or distributed as desired. Although the description above relates generally to computer-executable instructions of a computer program that runs on a computer and/or computers, the user interfaces, methods and systems also can be implemented in combination with other program modules. Generally, program modules include routines, programs, components, data structures, etc. that perform particular tasks and/or implement particular abstract data types.

Moreover, the subject matter described herein can be practiced with most any suitable computer system configurations, including single-processor or multiprocessor computer systems, mini-computing devices, mainframe computers, personal computers, stand-alone computers, hand-held computing devices, wearable computing devices, microprocessor-based or programmable consumer electronics, and the like as well as distributed computing environments in which tasks are performed by remote processing devices that are linked through a communications network. In a distributed computing environment, program modules can be located in both local and remote memory storage devices. The methods and systems described herein can be embodied on a computer-readable medium having computer-executable instructions as well as signals (e.g., electronic signals) manufactured to transmit such information, for instance, on a network.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing some of the claims.

It is, of course, not possible to describe every conceivable combination of components or methodologies that fall within the claimed subject matter, and many further combinations and permutations of the subject matter are possible. While a particular feature may have been disclosed with respect to only one of several implementations, such feature can be combined with one or more other features of the other implementations of the subject matter as may be desired and advantageous for any given or particular application.

Moreover, it is to be appreciated that various aspects as described herein can be implemented on portable computing devices (e.g., field medical device), and other aspects can be implemented across distributed computing platforms (e.g., remote medicine, or research applications). Likewise, various aspects as described herein can be implemented as a set of services (e.g., modeling, predicting, analytics, etc.).

Figure 7:
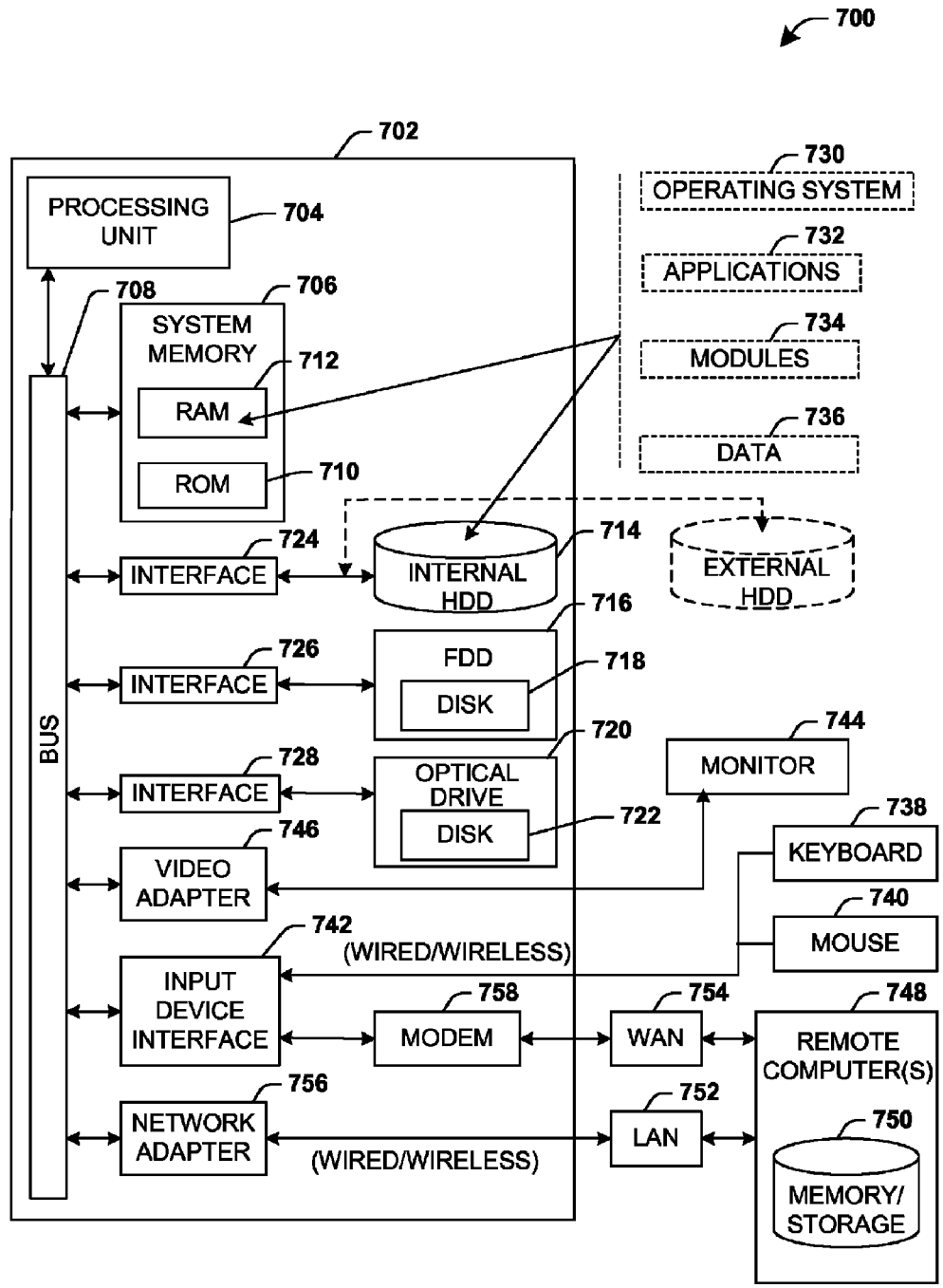
FIG. 7 is a block diagram of an exemplary computing environment.

FIG. 7 illustrates a block diagram of a computer operable to execute the disclosed architecture. In order to provide additional context for various aspects of the subject specification, FIG. 7 and the following discussion are intended to provide a brief, general description of a suitable computing environment 700 in which the various aspects of the specification can be implemented. While the specification has been described above in the general context of computer-executable instructions that may run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the specification may also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

More particularly, and referring to FIG. 7, an example environment 700 for implementing various aspects as described in the specification includes a computer 702, the computer 702 including a processing unit 704, a system memory 706 and a system bus 708. The system bus 708 couples system components including, but not limited to, the system memory 706 to the processing unit 704. The processing unit 704 can be any of various commercially available processors. Dual microprocessors and other multi-processor architectures may also be employed as the processing unit 704.

The system bus 708 can be any of several types of bus structure that may further interconnect to a memory bus (with or without a memory controller), a peripheral bus, and a local bus using any of a variety of commercially available bus architectures. The system memory 706 includes read-only memory (ROM) 710 and random access memory (RAM) 712. A basic input/output system (BIOS) is stored in a non-volatile memory 710 such as ROM, EPROM, EEPROM, which BIOS contains the basic routines that help to transfer information between elements within the computer 702, such as during start-up. The RAM 712 can also include a high-speed RAM such as static RAM for caching data.

The computer 702 further includes an internal hard disk drive (HDD) 714 (e.g., EIDE, SATA), which internal hard disk drive 714 may also be configured for external use in a suitable chassis (not shown), a magnetic floppy disk drive (FDD) 716, (e.g., to read from or write to a removable diskette 718) and an optical disk drive 720, (e.g., reading a CD-ROM disk 722 or, to read from or write to other high capacity optical media such as the DVD). The hard disk drive 714, magnetic disk drive 716 and optical disk drive 720 can be connected to the system bus 708 by a hard disk drive interface 724, a magnetic disk drive interface 726 and an optical drive interface 728, respectively. The interface 724 for external drive implementations includes at least one or both of Universal Serial Bus (USB) and IEEE 1394 interface technologies. Other external drive connection technologies are within contemplation of the subject specification.

The drives and their associated computer-readable media provide nonvolatile storage of data, data structures, computer-executable instructions, and so forth. For the computer 702, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the example operating environment, and further, that any such media may contain computer-executable instructions for performing the methods of the specification.

A number of program modules can be stored in the drives and RAM 712, including an operating system 730, one or more application programs 732, other program modules 734 and program data 736. All or portions of the operating system, applications, modules, and/or data can also be cached in the RAM 712. It is appreciated that the specification can be implemented with various commercially available operating systems or combinations of operating systems.

A user can enter commands and information into the computer 702 through one or more wired/wireless input devices, e.g., a keyboard 738 and a pointing device, such as a mouse 740. Other input devices (not shown) may include a microphone, an IR remote control, a joystick, a game pad, a stylus pen, touch screen, or the like. These and other input devices are often connected to the processing unit 704 through an input device interface 742 that is coupled to the system bus 708, but can be connected by other interfaces, such as a parallel port, an IEEE 1394 serial port, a game port, a USB port, an IR interface, etc.

A monitor 744 or other type of display device is also connected to the system bus 708 via an interface, such as a video adapter 746. In addition to the monitor 744, a computer typically includes other peripheral output devices (not shown), such as speakers, printers, etc.

The computer 702 may operate in a networked environment using logical connections via wired and/or wireless communications to one or more remote computers, such as a remote computer(s) 748. The remote computer(s) 748 can be a workstation, a server computer, a router, a personal computer, portable computer, microprocessor-based entertainment appliance, a peer device or other common network node, and typically includes many or all of the elements described relative to the computer 702, although, for purposes of brevity, only a memory/storage device 750 is illustrated. The logical connections depicted include wired/wireless connectivity to a local area network (LAN) 752 and/or larger networks, e.g., a wide area network (WAN) 754. Such LAN and WAN networking environments are commonplace in offices and companies, and facilitate enterprise-wide computer networks, such as intranets, all of which may connect to a global communications network, e.g., the Internet.

When used in a LAN networking environment, the computer 702 is connected to the local network 752 through a wired and/or wireless communication network interface or adapter 756. The adapter 756 may facilitate wired or wireless communication to the LAN 752, which may also include a wireless access point disposed thereon for communicating with the wireless adapter 756.

When used in a WAN networking environment, the computer 702 can include a modem 758, or is connected to a communications server on the WAN 754, or has other means for establishing communications over the WAN 754, such as by way of the Internet. The modem 758, which can be internal or external and a wired or wireless device, is connected to the system bus 708 via the serial port interface 742. In a networked environment, program modules depicted relative to the computer 702, or portions thereof, can be stored in the remote memory/storage device 750. It will be appreciated that the network connections shown are example and other means of establishing a communications link between the computers can be used.

The computer 702 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10 BaseT wired Ethernet networks used in many offices.

Figure 8:
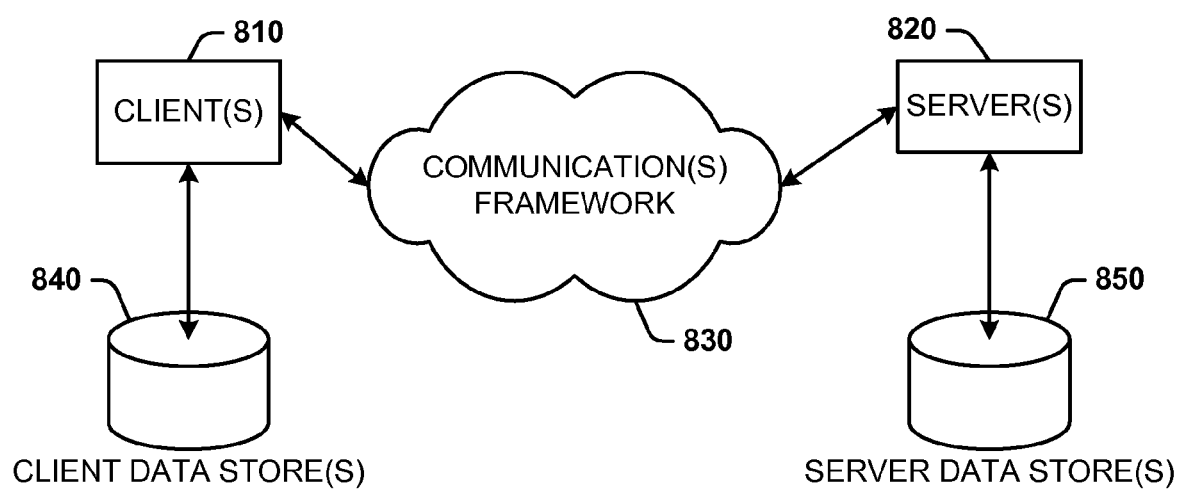
FIG. 8 is a block diagram of an exemplary networked computing environment.

Referring now to FIG. 8, there is illustrated a schematic block diagram of an exemplary computing environment 800 in accordance with the subject invention. The system 800 includes one or more client(s) 810. The client(s) 810 can be hardware and/or software (e.g., threads, processes, computing devices). The client(s) 810 can house cookie(s) and/or associated contextual information by employing the subject invention, for example. The system 800 also includes one or more server(s) 820. The server(s) 820 can also be hardware and/or software (e.g., threads, processes, computing devices). The servers 820 can house threads to perform transformations by employing the subject methods and/or systems for example. One possible communication between a client 810 and a server 820 can be in the form of a data packet adapted to be transmitted between two or more computer processes. The data packet may include a cookie and/or associated contextual information, for example. The system 800 includes a communication framework 830 (e.g., a global communication network such as the Internet) that can be employed to facilitate communications between the client(s) 810 and the server(s) 820.

Communications can be facilitated via a wired (including optical fiber) and/or wireless technology. The client(s) 810 are operatively connected to one or more client data store(s) 840 that can be employed to store information local to the client(s) 810 (e.g., cookie(s) and/or associated contextual information). Similarly, the server(s) 820 are operatively connected to one or more server data store(s) 850 that can be employed to store information local to the servers 820.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method comprising:
    receiving data for storage and management, the data comprising a plurality of data items;
    assigning the plurality of data items to a plurality of equivalency classes using a sampling algorithm, the plurality of equivalency classes comprising a random sample of the data stored on a solid state storage device;
    appending the data according to one or more operations of the sampling algorithm, the appending comprising semi-random writing of the data onto the solid state storage device, the semi-random writing being based at least on accessing a plurality of blocks of the solid state storage device randomly and providing sequential access to the data within individual pages of the plurality of blocks of the solid state storage device;
    identifying, using the sampling algorithm, an individual equivalency class of individual data items to discard according to one or more criteria; and
    discarding the individual data items of the individual equivalency class identified by the sampling algorithm, the discarding comprising block-wise erasure of the individual data items of the individual equivalency class identified by the sampling algorithm while remaining equivalency classes of the random sample remain stored on the solid state storage device,
    wherein other individual equivalency classes from the remaining equivalency classes are subsequently discarded using the block-wise erasure of the solid state storage device.

2. The method as recited in claim 1, further comprising performing time window sampling operations on the data according to the sampling algorithm, wherein the random sample is received during a time window and other data is received outside of the time window that is not included in the random sample.

3. The method as recited in claim 1, further comprising performing one or more time decay sampling operations on the data according to the sampling algorithm such that probabilities of the individual data items remaining in the random sample decay over time.

4. The method as recited in claim 1, further comprising monitoring whether the data is expiring.

5. The method as recited in claim 1, further comprising performing one or more weighted sampling operations on the data according to the sampling algorithm such that probabilities of the individual data items remaining in the random sample are proportional to weights assigned to the individual data items.

6. The method as recited in claim 1, further comprising performing one or more random sampling operations on the data according to the sampling algorithm.

7. The method as recited in claim 1, further comprising appending one or more new data items on the solid state storage device according to the sampling algorithm.

8. The method as recited in claim 1, further comprising storing the plurality of equivalency classes using a B-File.

9. The method as recited in claim 1, further comprising maintaining an in-memory page of one or more recently inserted data items.

10. A method comprising:
    receiving data for storage and management, the data comprising a plurality of data items;
    assigning the plurality of data items to a plurality of buckets using a sampling algorithm, the plurality of buckets comprising a sample of the data stored on a solid state storage device;
    appending the data according to one or more operations of the sampling algorithm, the appending comprising writing of the data onto the solid state storage device, the writing being based at least on writing to a plurality of blocks of the solid state storage device, wherein the data is stored within individual pages of the plurality of blocks of the solid state storage device;

identifying, using the sampling algorithm, an individual bucket of individual data items to discard according to one or more criteria; and discarding the individual data items of the individual bucket identified by the sampling algorithm, the discarding comprising block-wise erasure of the individual data items of the individual bucket identified by the sampling algorithm while remaining buckets of the sample remain stored on the solid state storage device, wherein other buckets from the remaining buckets are subsequently discarded together using the block-wise erasure of the solid state storage device.

11. The method of claim 10, further comprising:

determining a relative priority for deletion of the individual data items in the individual bucket identified by the sampling algorithm to discard compared to remaining individual data items in the remaining buckets that remain stored on the solid state storage device.

12. The method of claim 9, wherein the individual data items of the individual bucket have the same relative priority while the remaining individual data items have different relative priorities than the individual data items of the individual bucket.

13. The method of claim 10, further comprising:

maintaining, by the sampling algorithm, a logarithmic number of buckets.

14. The method of claim 10, further comprising applying a rising threshold to received data items to determine whether the received data items are selected to be included in the sample by the sampling algorithm.

15. The method of claim 10, wherein the discarding is performed responsive to a sample size of the sample stored on the solid state storage device reaching a specified upper bound.

16. A system comprising:

a processor;

a data storage and management engine configured to execute on the processor; and solid state storage device, wherein the data storage and management engine is further configured to:

receive data comprising a plurality of data items;

assign the plurality of data items to a plurality of levels using a sampling algorithm, the plurality of levels comprising a sample of the data stored on the solid state storage device;

append the data according to one or more operations of the sampling algorithm, including semi-random writing of the data onto the solid state storage device, the semi-random writing being based on at least:

random access to a plurality of blocks of the solid state storage device, and sequential access to the data within individual pages of the plurality of blocks of the solid state storage device;

identify, using the sampling algorithm, an individual level of individual data items to discard according to one or more criteria; and discard the individual data items of the individual level identified by the sampling algorithm via block-wise erasure of the individual data items of the individual level identified by the sampling algorithm while remaining levels of the sample remain stored on the solid state storage device, wherein other levels from the remaining levels are discarded using the block-wise erasure of the solid state storage device.

17. The system according to claim 16, wherein the sampling algorithm is configured to maintain a range of a sample size of the sample between a specified lower bound and a specified upper bound.

18. The system according to claim 16, wherein the sample is a random sample provided by the sampling algorithm and the random sample comprises other individual data items of the remaining levels of the random sample that have not been discarded.

19. The system according to claim 16, wherein the individual level identified by the sampling algorithm includes more of the plurality of data items than any other level.

20. The system according to claim 16, wherein the data storage and management engine is configured to store the data using a B-FILE data structure.

* * * * *